United States Patent
Gibbs et al.

(10) Patent No.: US 7,474,089 B2
(45) Date of Patent: Jan. 6, 2009

(54) CONTACT MECHANISM CLEANING

(75) Inventors: Byron Harry Gibbs, McKinney, TX (US); Charles Allen Martin, Melissa, TX (US)

(73) Assignee: Texas Instruments Incorporated, Dallas, TX (US)

( * ) Notice: Subject to any disclaimer, the term of this patent is extended or adjusted under 35 U.S.C. 154(b) by 20 days.

(21) Appl. No.: 11/646,936

(22) Filed: Dec. 28, 2006

(65) Prior Publication Data
US 2008/0156352 A1    Jul. 3, 2008

(51) Int. Cl.
*G01R 31/02* (2006.01)
(52) U.S. Cl. .................... 324/158.1; 324/73.1; 324/757
(58) Field of Classification Search .................... None
See application file for complete search history.

(56) References Cited

U.S. PATENT DOCUMENTS

| | | | |
|---|---|---|---|
| 5,491,424 A * | 2/1996 | Asar et al. ................... 324/715 |
| 6,181,144 B1 | 1/2001 | Hembree et al. |
| 6,218,848 B1 | 4/2001 | Hembree et al. |
| 6,573,702 B2 * | 6/2003 | Marcuse et al. ........... 324/158.1 |
| 7,005,880 B1 * | 2/2006 | Buss et al. ................... 324/765 |
| 2004/0145386 A1 * | 7/2004 | Byun et al. ................. 324/765 |
| 2004/0181304 A1 | 9/2004 | Collier |
| 2005/0001645 A1 | 1/2005 | Humphrey et al. |
| 2006/0144423 A1 * | 7/2006 | Tan ............................. 134/18 |

* cited by examiner

*Primary Examiner*—Minh N Tang
(74) *Attorney, Agent, or Firm*—Yingsheng Tung; Wade J. Brady, III; Frederick J. Telecky, Jr.

(57) ABSTRACT

One embodiment of the present invention includes a method for reactively cleaning a contact mechanism. The method includes measuring contact resistance (CRES) associated with a plurality of electrical contacts of the contact mechanism. The method also includes generating at least one statistic of the measured CRES associated with the plurality of electrical contacts of the contact mechanism, and comparing the at least one statistic of the CRES associated with the plurality of electrical contacts of the contact mechanism with at least one CRES threshold parameter associated with an unacceptable level of CRES. The method further includes cleaning the plurality of electrical contacts of the contact mechanism based on the comparison of the at least one statistic of the CRES and the at least one CRES threshold parameter.

18 Claims, 3 Drawing Sheets

CONTACT MECHANISM CLEANING

TECHNICAL FIELD

This invention relates to electronic circuit testing, and more specifically to systems and methods for reactively cleaning a contact mechanism.

BACKGROUND

To maintain product quality, manufacturers of semiconductor devices perform tests on their products prior to shipment to consumers. During testing, one or more devices-under-test (DUTs) are stimulated by signals from automatic test equipment (ATE) which is configured to receive and analyze the responses from the DUTs. As an example, DUTs can include dies on a wafer or integrated circuit (IC) chips. The stimuli and responses between the ATE and the DUTs are passed through interface equipment, including a contact mechanism that makes electrical contact with contact surfaces of the DUTs. By analyzing the responses of the DUTs to the stimuli, the ATE can determine whether a given DUT is to be accepted or rejected.

For example, during probe testing of a wafer, the contact mechanism can include a probe card affixed to a prober, such that the prober maneuvers a wafer to bring the contact surfaces of dies into electrical contact with needles of the probe card. As another example, during testing at a final stage of production, the contact mechanism can be a load board containing IC receptacles with contact pins, such that a handler manipulates IC chips and plugs them into the IC receptacles. Thus, a given contact mechanism, such as a probe card or a load board, is used to make electrical connections with contact surfaces of the DUTs to deliver stimuli and receive responses, respectively, between the ATE and the DUTs for a determination of whether a given DUT is to be accepted or rejected.

Contact surfaces of dies or IC chips, as well as electrical contacts of the contact mechanism may be formed from metals that can oxidize (e.g., aluminum, tin, and/or copper). As a result, the action of making contact cuts and/or scrubs through a formed oxide layer may result in the flaking-off and/or accumulation of debris. Oxides, debris from repeated contact action, moisture from the humidity controlled test environment, and/or contaminates inherent to semiconductor processes can adhere to the contact surfaces of the contact mechanism, degrading connectivity performances. Therefore, stimuli and responses between the ATE and the DUTs can become distorted, thus introducing the possibility of false negative test results. Accordingly, a semiconductor manufacturer can lose money by scrapping devices that falsely fail tests through unreliable test data measurements.

Typically, a semiconductor device manufacturer can occasionally clean the electrical contacts of the contact mechanism to remove debris and/or restore conductivity. Automated periodic cleaning may be used to clean the electrical contacts of the contact mechanism, such that user specified parameters govern when and how cleaning is to be performed. Typically, these parameters are set so as to preserve reliable test results under worst-case scenarios. Therefore, after cleaning the contact mechanism, reliable testing of the DUTs may be assured. However, cleaning too often or too aggressively can result in excessive mechanical wear of the contact surfaces of the contact mechanism. Thus, the useful life of a contact mechanism can be shortened, resulting in a need for frequent replacement at elevated testing costs.

SUMMARY

One embodiment of the present invention includes a method for reactively cleaning a contact mechanism. The method comprises measuring contact resistance (CRES) associated with a plurality of electrical contacts of the contact mechanism. The method also comprises generating at least one statistic of the measured CRES associated with the plurality of electrical contacts of the contact mechanism, and comparing the at least one statistic of the CRES associated with the plurality of electrical contacts of the contact mechanism with at least one CRES threshold parameter associated with an unacceptable level of CRES. The method further comprises cleaning the plurality of electrical contacts of the contact mechanism based on the comparison of the at least one statistic of the CRES and the at least one CRES threshold parameter.

Another embodiment of the present invention includes a functional test system. The functional test system comprises a contact mechanism configured to deliver stimuli to and obtain responses from a plurality of devices-under-test (DUTs). The contact mechanism comprises a plurality of electrical contacts. The responses can be determinative of one of acceptance and failure for each of the plurality of DUTs. The functional test system also comprises a CRES tester configured to measure CRES associated with at least one of the plurality of electrical contacts of the contact mechanism and to generate a statistical data set based on the measured CRES and at least one of the plurality of DUTs. The functional test system also comprises a data analysis system configured to generate and/or apply at least one CRES threshold parameter for the contact mechanism. The at least one CRES threshold parameter can be determinative of when to clean the contact mechanism based on at least one CRES statistic in the statistical data set.

Another embodiment of the present invention includes a functional test system. The functional test system comprises means for providing stimuli to and obtaining responses from a plurality of DUTs. The responses can be determinative of one of acceptance and failure for each of the plurality of DUTs. The functional test system also comprises means for measuring CRES associated with the means for obtaining the responses. The functional test system also comprises means for generating a statistical data set based on the calculated CRES associated with the means for obtaining the responses. The functional test system further comprises means for cleaning the means for obtaining the responses based on the statistical data set and at least one CRES threshold parameter.

DETAILED DESCRIPTION

The present invention relates to electronic circuit testing, and more specifically to a reactively cleaning a contact mechanism. A contact mechanism delivers stimuli to at least one device-under-test (DUT), and transmits corresponding responses to the stimuli from the at least one DUT to automatic test equipment (ATE). The contact mechanism can be a probe card and/or an integrated circuit (IC) receptacle that includes a plurality of electrical contacts. The DUT can be any of a variety of semiconductor devices having at least one electrical contact, such as a semiconductor die on a wafer, a printed circuit board, and/or an IC chip. Contact resistance (CRES) can be measured for a plurality of electrical contacts of the contact mechanism. For example, the ATE can measure the CRES associated with at least one pin of an IC receptacle or probe needle on a probe card.

The CRES measurements can be saved in a memory, such that a statistical data set can be generated. The statistical data set can be generated by using one or more statistical functions, algorithms, and/or techniques. One or more filtering methods may also be optionally applied while generating the statistical data set. As an example, the statistical data set can be analyzed to implement reactive and/or adaptive cleaning of the contact mechanism. As an example, at least one CRES statistic can be computed and compared with a threshold to determine when to clean the electrical contacts of the contact mechanism. As another example, the electrical contacts of the contact mechanism can also be cleaned periodically, or based on repeated failures or percentages of failures of the DUTs. The at least one CRES statistic can thus be compared with a threshold to adjust the frequency and/or aggressiveness of cleaning of the electrical contacts of the contact mechanism.

Figure 1:
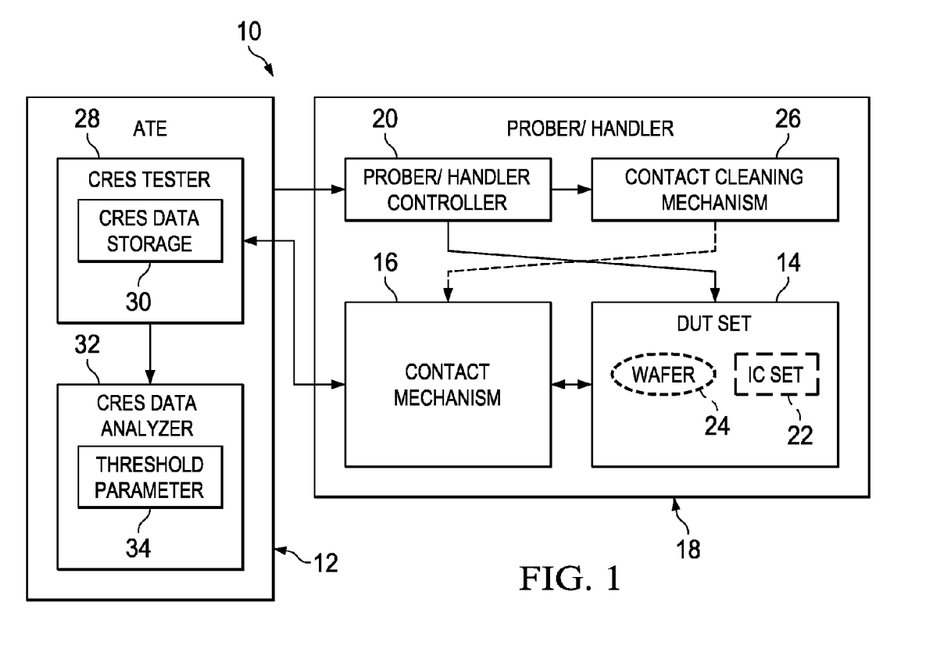
FIG. 1 illustrates an example of a functional test system in accordance with an aspect of the invention.

FIG. 1 illustrates a functional test system 10 in accordance with an aspect of the invention. The functional test system 10 includes ATE 12 that is configured to generate stimuli for and receive responses from a set of DUTs, demonstrated in the example of FIG. 1 as a DUT set 14. The responses can be determinative of acceptance or failure of a given DUT of the DUT set 14 based on the stimuli provided to the DUT. To provide the stimuli to the DUT set 14, the ATE 12 utilizes a contact mechanism 16. For example, the ATE 12 and the contact mechanism 16 can be electrically coupled, such that the contact mechanism 16 can provide electrical connection between the ATE 12 and the DUT set 14. Thus, the ATE 12 can generate the stimuli and apply it to a given DUT of the DUT set 14 via the contact mechanism 16. In addition, the ATE 12 can receive the responses from the given DUT of the DUT set 14 via the contact mechanism 16. The ATE 12 can analyze the responses to determine whether the given DUT of the DUT set 14 should be accepted or rejected.

In the example of FIG. 1, the functional test system 10 includes a prober/handler 18. The ATE 12 provides commands to the prober/handler 18 via a prober/handler controller 20 that instructs the prober/handler 18 to index between the DUTs in the DUT set 14 for testing. The ATE 12 can also provide commands to the prober/handler 18 via the prober/handler controller 20 of when and how to clean the contact mechanism 16, as demonstrated in greater detail below. Stimuli from the ATE 12 and corresponding responses from the DUT set 14 are passed via the electrical connections provided by the contact mechanism 16. As an example, the DUT set 14 can include an IC set 22 that includes a plurality of IC chips on a rack, such that the contact mechanism 16 is a load board with one or more IC receptacles. As such, for example, the ATE 12 can control a handler 18 to retrieve one or more IC chips from the rack and insert them into IC receptacles, upon which the ATE 12 can provide stimuli to and obtain responses from the inserted one or more IC chips in the DUT set 14 via the electrical connections of the contact mechanism 16. As another example, the DUT set 14 can include a plurality of dies on a wafer 24, such that the contact mechanism 16 is a probe card. As such, for example, the ATE 12 can control a prober 18 to position the dies such that their contact surfaces are in electrical contact with the pins of the probe card, upon which the ATE 12 can generate the stimuli and obtain the responses via the electrical connections of the contact mechanism 16. Therefore, it is to be understood that the prober/handler 18 is intended to represent either a prober or a handler in the example of FIG. 1, depending on the types of DUTs in the DUT set 14.

Through the repetitive action of testing DUTs in the DUT set 14, the electrical contacts of the contact mechanism 16 can be repeatedly and/or continuously exposed to contaminates. For example, the contaminates can stem from such sources as humidity, semiconductor process contaminates, and/or debris generated by the cutting and/or scrubbing action resulting from the contacting process itself. The repeated and/or continuous exposure can result in accumulation of the contaminates on the electrical contacts of the contact mechanism 16. Through the repeated contact of the contact mechanism 16 with the DUTs in the DUT set 14, aggravated by vibration and electrical current flow, CRES of the electrical contacts of the contact mechanism 16 increases as conductivity degrades. Increased amounts of CRES can result in distortion of the stimuli generated by the ATE 12, improper responses to the stimuli by the DUTs in the DUT set 14, and/or inaccurate measurements of the responses by the ATE 12. To avoid or eliminate this degradation, the electrical contacts of the contact mechanism 16 can be cleaned.

The prober/handler controller 20 can be configured to clean the contact mechanism 16 via a contact cleaning mechanism 26. For example, the ATE 12 can command a prober to move the contact cleaning mechanism 26 to the contact mechanism 16, such that the contact cleaning mechanism 26 cleans one or more of the electrical contacts of the contact mechanism 16. As another example, the ATE 12 can command a handler to mechanically move the contact cleaning mechanism 26 to the contact mechanism 16 (e.g., IC receptacle), such that the contact cleaning mechanism 26 cleans one or more of the electrical contacts of the contact mechanism 16. In addition, the contact cleaning mechanism 26 can be invoked manually, such that the ATE 12 provides an indication to an operator of the functional test system 10 that a cleaning of the contact mechanism 16 is necessary. Thus, the operator can invoke a cleaning event of the contact mechanism 16, or perform a manual cleaning of the contact mechanism 16, in response to the indication.

The functional test system 10 includes a CRES tester 28. The CRES tester 28 is configured to obtain CRES data associated with the electrical contacts of the contact mechanism 16. As an example, the CRES tester 28 can provide commands to the ATE 12 to obtain CRES data for a given DUT of the DUT set 14. For example, the ATE 12 can send specific CRES stimuli to a given DUT in the DUT set 14 and receive a response from the given DUT. From the stimuli and response data, CRES may be computed. The measurement of CRES can be at regular intervals, for example, based on the testing of DUTs, such as a measurement of CRES once for every one hundred DUTs in the DUT set 14. As another example, the commands to the ATE to measure CRES can be at regular intervals based on elapsed time, such as a measurement of CRES once every hour. The commands to the ATE 12 to measure CRES can also be event driven, such that CRES can be measured for the contact mechanism 16 upon startup of the functional test system 10, upon receiving a new DUT set 14, and/or upon one or more of the DUTs in the DUT set 14 failing based on received responses to stimuli.

In addition to obtaining the CRES for one or more of the electrical contacts of the contact mechanism 16, the CRES tester 28 can also include a CRES data storage 30. The CRES data storage 30 can be a memory, or can be a software based file, such as a database or spreadsheet. The CRES data storage 30 can be implemented to generate one or more statistics associated with the CRES data for the one or more electrical contacts of the contact mechanism 16. The one or more statistics of the CRES data for the electrical contacts of the contact mechanism 16 can be compiled as a statistical data set that can be based on CRES measurements across one or more of the DUTs in the DUT set 14.

As an example, the statistical data set of the CRES data storage 30 can include an aggregate measurement of the CRES associated with the electrical contacts of the contact mechanism 16. For example, the statistical data set can include a mean value of the CRES, such as a moving average of the CRES associated with at least one of the electrical contacts of the contact mechanism 16 for at least some of the DUTs of the DUT set 14, and/or a moving average of the CRES for at least some of the electrical contacts of the contact mechanism 16 across at least one of the DUTs in the DUT set 14. As another example, the statistical data set can include standard deviation values of the CRES data, such as a standard deviation value of the CRES data associated with at least one of the electrical contacts of the contact mechanism 16 for at least some of the DUTs of the DUT set 14, and/or a standard deviation value of the CRES data for at least some of the electrical contacts of the contact mechanism 16 across at least one of the DUTs in the DUT set 14. Furthermore, the statistical data set can also include computational composite usage, such as an upper percentile statistical value minus a mean or median value to normalize data within the statistical data set.

The functional test system 10 also includes a CRES data analyzer 32. The CRES data analyzer 32 is configured to access the statistical data set for a determination of when to clean the electrical contacts of the contact mechanism 16. The CRES data analyzer 32 can include at least one CRES threshold parameter 34. As an example, the ATE 12 can be configured to reactively clean the contact mechanism 16. Thus, the CRES threshold parameter 34 can be a CRES value that is undesirable for one or more of the electrical contacts of the contact mechanism 16. As such, the CRES threshold parameter 34 can be a value that signals a need to clean one or more of the electrical contacts of the contact mechanism 16 upon the one or more of the electrical contacts of the contact mechanism 16 having exceeded the CRES threshold parameter 34. As another example, the ATE 12 can be configured to adaptively clean the contact mechanism 16. Thus, the CRES threshold parameter 34 can be analyzed to determine if an adjustment to the frequency and/or aggressiveness of cleaning of the contact mechanism 16 is needed. For example, based on the CRES threshold parameter 34, the ATE 12 can determine that the contact mechanism 16 needs to be cleaned more often than a preset frequency of cleaning.

In the example of a reactive cleaning configuration, the CRES threshold parameter 34 can include at least one CRES threshold value that, upon the measured CRES of one of the electrical contacts of the contact mechanism 16 exceeding the at least one CRES threshold value, the CRES data analyzer 32 can command the prober/handler controller 20 to clean the contact mechanism 16. As an example, the CRES data analyzer 32 can analyze the statistical data set in the CRES data storage 30 to determine ideal CRES threshold values for at least one of the electrical contacts of the contact mechanism 16, such that the CRES threshold parameter 34 includes individually adjustable CRES threshold values for at least one of the electrical contacts of the contact mechanism 16. As such, the CRES data analyzer 32 can command the prober/handler controller 20 to clean the electrical contacts of the contact mechanism 16 upon the measured CRES of one or more of the electrical contacts exceeding its respective CRES threshold value, or exceeding a CRES threshold parameter 34 that is an average CRES threshold value based on the individually adjustable CRES threshold values.

As yet another example, the CRES data analyzer 32 can prompt cleaning of the electrical contacts of the contact mechanism 16 upon the mean value of the measured CRES of the electrical contacts exceeding a given CRES threshold value in the CRES threshold parameter 34. As such, the ATE 12 may continue to test DUTs of the DUT set 14 even when some of the electrical contacts of the contact mechanism 16 have CRES values that exceed their respective threshold values. In addition, the CRES data analyzer 32 can include standard deviation information from the statistical data set in evaluating mean value of the measured CRES for a determination of when to clean the contact mechanism 16. Furthermore, as the CRES threshold parameter 34 is adjustable, and may not be representative of all undesirable CRES data scenarios, the contact mechanism 16 can be cleaned based on a consistent determination of failure of a subset of the DUT set 14 based on the test data. For example, upon five consecutive failures of DUTs in the DUT set 14 based on the obtained test data, the contact mechanism 16 can be cleaned. It is therefore to be understood that the CRES data analyzer 32 can be configured in any of a variety of ways to invoke a cleaning of the contact mechanism 16 based on the CRES threshold parameter 34 and the statistical data set of the CRES data stored in the CRES data storage 30.

In the example of an adaptive cleaning configuration, the contact mechanism 16 can be cleaned at periodic intervals, such as based on testing a predetermined number of DUTs in the DUT set 14, or such as based on a predetermined amount of time. The CRES threshold parameter 34 can include at least one CRES threshold value that can be consulted at the conclusion of the predetermined periodic interval. The CRES data analyzer 32 can adjust the frequency and/or aggressiveness of the cleaning of the contact mechanism 16 based on a comparison of the measured CRES and the at least one CRES threshold value. For example, if the measured CRES of one or more of the electrical contacts of the contact mechanism 16 exceeds the at least one CRES threshold value, the CRES data analyzer 32 can reduce the predetermined periodic interval, such that the contact mechanism 16 can be cleaned more often. As another example, if the measured CRES of one or more of the electrical contacts of the contact mechanism 16 exceeds the at least one CRES threshold value, the CRES data analyzer 32 can adjust cleaning parameters associated with the contact cleaning mechanism 26, such that the contact mechanism 16 is cleaned more thoroughly (e.g., additional scrubbing per clean, more cleaning overtravel, etc.).

If the measured CRES of one or more of the electrical contacts of the contact mechanism 16 is less than the at least one CRES threshold value, the CRES data analyzer 32 can increase the predetermined periodic interval, such that the contact mechanism 16 can be cleaned less often. As another example, if the measured CRES of one or more of the electrical contacts of the contact mechanism 16 is less than the at least one CRES threshold value, the CRES data analyzer 32 can adjust cleaning parameters associated with the contact cleaning mechanism 26, such that the contact mechanism 16 is cleaned less thoroughly. As such, the at least one CRES threshold value can be set such that the timing of the cleaning the contact mechanism 16 is optimized, such that the contact mechanism 16 cleaned at the appropriate frequency and/or aggressiveness, thus extending the operable life of the contact mechanism 16.

As yet another example, the CRES threshold parameter 34 can include two or more CRES threshold values that represent a range of acceptable values of measured CRES values for a given periodic testing interval and/or cleaning configuration. Thus, the frequency and/or aggressiveness of cleaning of the contact mechanism 16 can be increased if the measured CRES values are above the range, and the frequency and/or aggressiveness of cleaning of the contact mechanism 16 can be decreased if the measured CRES values are below the range. In addition, the one or more CRES threshold values representative of an acceptable range of measured CRES values can be compared with a mean value of the measured CRES. The CRES data analyzer 32 can also include standard deviation information from the statistical data set in evaluating the mean value of the measured CRES for a determination of how to adjust the frequency and/or aggressiveness of cleaning the contact mechanism 16. It is therefore to be understood that the CRES data analyzer 32 can be configured in any of a variety of ways for the adaptive cleaning of the contact mechanism 16 based on the CRES threshold parameter 34 and the statistical data set of the CRES data stored in the CRES data storage 30.

It is to be understood that the functional test system 10 is not intended to be limited by the example of FIG. 1. For example, the contact mechanism 16 is not limited to a specific type of probe card or IC receptacle, but may include any of a variety of contact mechanisms that use a probe needle, Pogo Pin®, fuzz button, cobra needle, membrane pin, and/or any other means of making electrical connection. In addition, the DUT set 14 can include printed circuit boards (PCBs), and is thus not limited to dies on a wafer or IC chips. One or more components of the functional test system 10 can be integrated together, and/or subcomponents (e.g., the CRES data storage 30) can be separated from components in which they are included. In addition, the functional test system 10 is not limited to implementing one of reactive cleaning and adaptive cleaning of the contact mechanism 16, but can instead implement all of or selected elements of both reactive and adaptive cleaning configurations. Therefore, any of a variety of modifications are possible in the example of FIG. 1.

Figure 2:
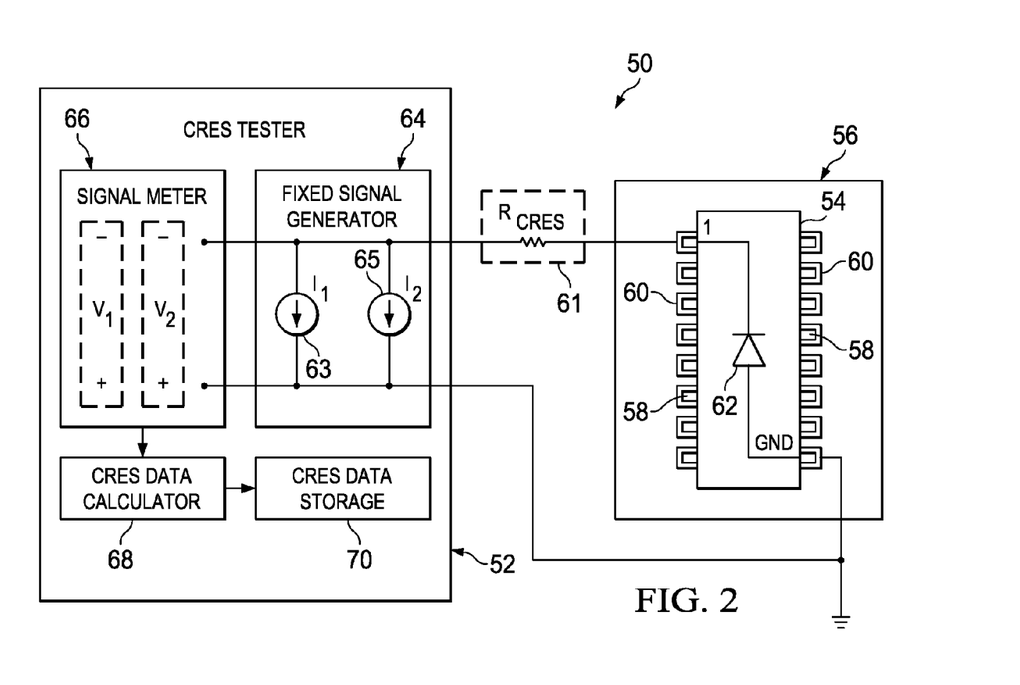
FIG. 2 illustrates an example of a CRES tester in accordance with an aspect of the invention.

FIG. 2 illustrates another example of a test system 50 in accordance with an aspect of the invention. The test system 50 includes a CRES tester 52 that is configured to measure CRES associated with one or more electrical contacts of a contact mechanism 56. In the example of FIG. 2, the DUT 54 is demonstrated as an IC chip having sixteen pins 58. However, it is to be understood that the DUT 54 can be any of a variety of semiconductor devices, such as a die on a wafer. In addition, the DUT 54 is demonstrated as having sixteen pins 58 for the sake of simplicity, but that it is to be understood that the DUT 54 can be an IC having any shape, size, or number of pins. The DUT 54 can be one of several DUTs in the DUT set 14 in the example of FIG. 1. As such, reference will be made to the example of FIG. 1 in the following discussion of the example of FIG. 2. In addition, in the example of FIG. 2, the CRES tester 52 is demonstrated as directly coupled to the contact mechanism 56. However, it is to be understood that the CRES tester 52 could be coupled to the contact mechanism 56 via ATE, such as demonstrated in the example of FIG. 1, and that the CRES tester 52 could be included in the ATE itself.

The contact mechanism 56 is demonstrated in the example of FIG. 2 as an IC receptacle with a plurality of pin sockets 60, each of the pin sockets 60 corresponding to one of the pins 58 of the DUT 54. The CRES tester 52 can be communicatively coupled to each of the pin sockets 60 of the contact mechanism 56, such that the CRES tester 52 can generate test signals to be applied to one or more of the pin sockets 60 of the contact mechanism 56. In the example of FIG. 2, the CRES tester 52 is demonstrated as coupled to the contact mechanism 56 at two of the pin sockets 60. However, it is to be understood that the CRES tester 52 could be coupled to one or more of the other sixteen pin sockets 60 to obtain the CRES data for the respective one or more of the pin sockets 60. Specifically, the CRES tester 52 is coupled to the pin socket 60 coupled to a ground pin GND of the DUT 54 and to the pin socket 60 that is coupled to pin 1 of the DUT 54. In the example of FIG. 2, the test system 50 includes a resistor 61 having a resistance value of $R_{CRES}$. The resistor 61 is representative of the CRES value (e.g., $R_{CRES}$) of the pin socket 60 associated with pin 1 of the DUT 54. It is to be understood that the CRES value of the pin socket 60 of the ground pin GND may be negligible, as the DUT 54 and the contact mechanism 56 may include several parallel ground connections. The DUT 54 includes an internal electro-static discharge (ESD) diode 62 interconnecting the ground pin GND and pin 1 of the DUT 54, with an anode coupled to the ground pin GND and a cathode coupled to pin 1. It is to be understood that, despite the example of FIG. 2 demonstrating the ESD diode 62 interconnecting pin GND and pin 1, any of a variety of conductive, resistive, and/or other circuit structures that can be measured for a conductive, resistive, and/or impedance path can be implemented in the example of FIG. 2, such that the path could include, for example, resistive, capacitive, and/or inductive components.

The CRES tester 52 includes a fixed signal generator 64 and a signal meter 66. The fixed signal generator 64 can be configured to output one or more signals having fixed values for current or voltage. As such, the signal meter 66 can be configured to input a received signal and measure an amount of voltage or current, respectively. In the example of FIG. 2, the fixed signal generator 64 is demonstrated as having a first current source 63 configured to provide a constant current $I_1$ and a second current source 65 configured to provide a constant current $I_2$. The signal meter 66 is thus demonstrated in the example of FIG. 2 to measure a first voltage $V_1$ that is associated with the first constant current $I_1$ and a second voltage $V_2$ that is associated with the second constant current $I_2$, as is explained in greater detail below. It is to be understood that the fixed signal generator 64 and the signal meter 66 could be oppositely configured as to that demonstrated in the example of FIG. 2. For example, the fixed signal generator 64 could instead be configured to provide one or more separate fixed voltages, such that the signal meter is instead configured to measure one or more current flows based on the fixed voltages.

For the CRES tester 52 to determine a resistance value $R_{CRES}$ of the pin socket 60 associated with pin 1 of the DUT 54, the fixed signal generator 64 applies the first constant current $I_1$ from the first current source 63. The first constant current $I_1$ forces a current flow through the ESD diode 62. In the example of FIG. 2, the first constant current $I_1$ can be considered a negative current, as the first constant current $I_1$ flows to ground. As such, the first constant current $I_1$ applied to the conductive or resistive path through the ESD diode 62 causes a resulting voltage $V_1$ at pin 1 that is negative relative to ground. Therefore, current is pulled from ground, through the ground pin GND, through the ESD diode 62, and through pin 1. The signal meter 66 measures the value of the resulting voltage $V_1$. It is to be understood that the value of the first constant current $I_1$ can be chosen to provide a value for the voltage $V_1$ that is sufficient to bias the ESD diode 62 adequately for operation in a substantially linear region, as opposed to a substantially unstable region at or near an activation voltage associated with the ESD diode 62.

It is to be understood that the voltage/current response of the ESD diode 62 may not be perfectly linear. As such, upon the signal meter 66 measuring the first voltage $V_1$, the fixed signal generator 64 may deactivate the first current source 63 and activate the second current source 65 to provide the second constant current $I_2$, which could be different from the first constant current $I_1$. Thus, a separate current is forced through the ESD diode 62, and the signal meter 66 measures the second voltage $V_2$ at pin 1 of the contact mechanism 56. It is to be understood that the activation of the first current source 63 and the second current source 65 may not be mutually exclusive, but that one of two constant currents can be provided to generate the first voltage $V_1$ by concurrently activating both the first current source 63 and the second current source 65. As such, one of the first current source 63 and the second current source 65 can be deactivated or changed to provide the other of the two constant currents to generate the second voltage $V_2$.

The CRES tester 52 also includes a CRES data calculator 68. The CRES data calculator 68 can be configured to calculate the CRES value $R_{CRES}$ for the socket pin 60 that is coupled to pin 1 of the DUT 54. For example, as the values for the first constant current $I_1$, the second constant current $I_2$, the first measured voltage $V_1$ and the second measured voltage $V_2$ are known, the resistance $R_{CRES}$ can easily be calculated for the socket pin 60 coupled to pin 1 of the DUT 54. As an example, the CRES data calculator can divide the difference of the first measured voltage $V_1$ and the second measured voltage $V_2$ by the difference of the first constant current $I_1$ and the second constant current $I_2$ to calculate $R_{CRES}$. It is to be understood that such a calculation can include other resistance values, such as resistances associated with the ESD diode 62, connecting electrical conductors, the CRES tester 52, and the DUT 54. However, these resistance values can be known values, and thus can be subtracted from a calculated resistance to determine the CRES value $R_{CRES}$. In addition, because both the first measured voltage $V_1$ and the second measured voltage $V_2$ are voltages sufficient to bias the ESD diode 62 in a substantially linear region, the calculated value for $R_{CRES}$ can be a substantially linear approximation of the CRES value associated with the pin socket 60 coupled to pin 1 of the DUT 54. It is to be understood that the CRES tester 52 can perform a similar operation for one or more additional pin sockets 60 of the contact mechanism 56 to obtain a separate CRES value $R_{CRES}$ for each of the one or more additional pin sockets 60.

The CRES tester 52 also includes a CRES data storage 70. The CRES data storage 70 can be a memory, or can be a software based file, such as a database or spreadsheet. The CRES data storage 70 can be implemented to store the calculated CRES values $R_{CRES}$ for each of the measured pin sockets 60 of the contact mechanism 56. In addition, the CRES data storage 70 can be configured to generate one or more statistics associated with the calculated CRES values for the one or more pin sockets 60 of the contact mechanism 56. The one or more statistics of the CRES data for the one or more pin sockets 60 of the contact mechanism 56 can be compiled as a statistical data set. As an example, the statistical data set of the CRES data stored in the CRES data storage 70 can include aggregate measurements of the CRES associated with the pin sockets 60 of the contact mechanism 56. For example, the statistical data set can include a mean value of the CRES data, such as a moving average of the CRES associated with the one or more pin sockets 60 of the contact mechanism 56 for the DUT 54, and/or a moving average of the CRES for each of the one or more pin sockets 60 of the contact mechanism 56 across a plurality of DUTs 54.

In a reactive cleaning configuration, the CRES tester 52, or a CRES data analyzer (not shown), such as the CRES data analyzer 32 in the example of FIG. 1, can determine whether the calculated CRES value is acceptable to continue testing additional DUTs or whether one or more of the pin sockets 60 of the contact mechanism 56 needs to be cleaned. Such a determination can also be made based on a determination of a failure of the DUT 54 as determined by ATE (not shown), such as the ATE 12 in the example of FIG. 1, such that the CRES value can be calculated upon a determination of failure. In an adaptive cleaning configuration, the CRES tester 52 or a CRES data analyzer can determine whether the calculated CRES value is within an acceptable range of one or more CRES threshold values for a given periodic testing interval for a set of the DUTs 54 and/or set of cleaning configuration parameters. Thus, the frequency and/or aggressiveness of cleaning can be increased or decreased based on the measured CRES values relative to the one or more CRES threshold values.

It is to be understood that the test system 50 is not limited to the example of FIG. 2. For example, the fixed signal generator 64 is not limited to two current sources, but can include more or less current sources, or can incorporate one or more voltage sources, to provide fixed signals to measure CRES. In addition, voltage and/or current measurements are not limited to measurements made associated with an ESD diode, such as the ESD diode 62. Furthermore, the DUT 54 is not limited to including a single ESD diode 62, but can include any of a variety of combinations of ESD diodes and other ESD protection devices, such that other signal measurements can be made to obtain CRES for the pin sockets 60 of the contact mechanism 56.

Figure 3:
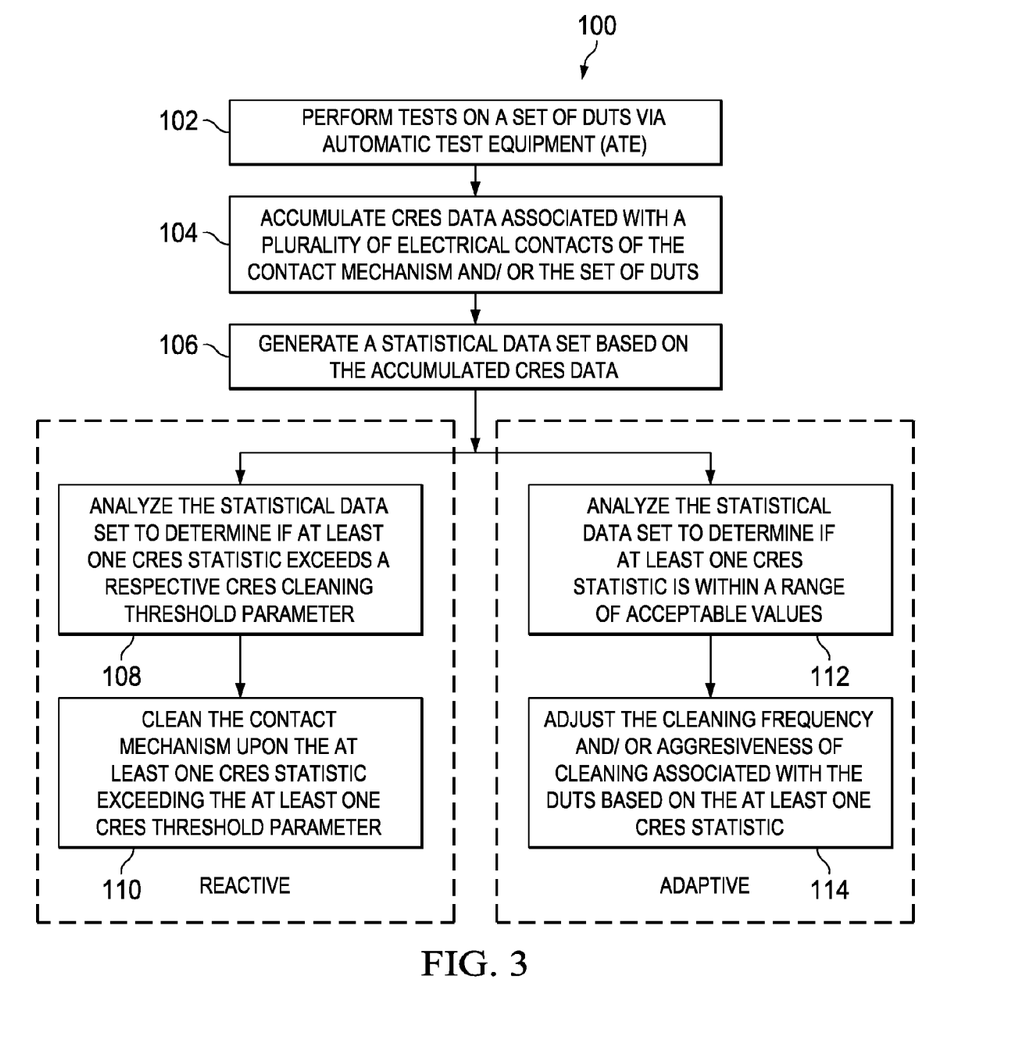
FIG. 3 illustrates an example of a method for cleaning a contact mechanism in accordance with an aspect of the invention.

In view of the foregoing structural and functional features described above, certain methods will be better appreciated with reference to FIG. 3. It is to be understood and appreciated that the illustrated actions, in other embodiments, may occur in different orders and/or concurrently with other actions. Moreover, not all illustrated features may be required to implement a method. It is to be further understood that the following methodologies can be implemented in hardware (e.g., a computer or a computer network), software (e.g., as executable instructions running on one or more computer systems), or any combination of hardware and software.

FIG. 3 illustrates an example of a method 100 for reactively cleaning a contact mechanism in accordance with an aspect of the invention. At 102, tests are performed on a set of DUTs via ATE. The tests can include stimuli generated by the ATE and provided to the set of DUTs via a contact mechanism, such that the ATE can receive responses from the set of DUTs based on the stimuli via the contact mechanism. The responses can be determinative of one of acceptance and failure of the at least one DUT. At 104, CRES data associated with a plurality of electrical contacts of the contact mechanism and/or the set of DUTs is accumulated. The measured CRES can be accumulated by the ATE or by a dedicated CRES tester. In addition, the accumulated CRES data can be measured and/or calculated at regular intervals, such as based on a number of tested DUTs or based on regular intervals of time. Alternatively or additionally, the measurement or calculation of CRES can also be event driven, such that CRES data can be determined for the contact mechanism upon a given DUT failing based on measured test data, or can be measured upon startup of the test system.

At 106, a statistical data set is generated based on the accumulated CRES data. The statistical data set can be based on CRES that is measured over a plurality of DUTs. The statistical data set can include mean values of the CRES data, such as a moving average of the CRES data associated with at least a portion of the electrical contacts of the contact mechanism for at least some of the plurality of DUTs, and/or a moving average of the CRES data for at least one electrical contact of the contact mechanism across the plurality of DUTs. The statistical data set can also include standard deviation values of the CRES data, such as a standard deviation value of the CRES data associated with at least some of the electrical contacts of the contact mechanism for at least some of the plurality of DUTs, and/or a standard deviation value of the CRES data for at least one electrical contact of the contact mechanism across the plurality of DUTs. The statistical data set can be stored in a CRES data storage, which can be a memory device or a software file.

In the example of FIG. 3, reference numbers 108 and 110 refer to a reactive cleaning configuration. At 108, the statistical data set is analyzed to determine if at least one CRES statistic exceeds a respective CRES cleaning threshold parameter. The CRES threshold parameter can include at least one value, such that it can apply to one or more of the individual electrical contacts of the contact mechanism, or can be applied to the mean value of the CRES data of the electrical contacts. The CRES threshold parameter can also be a plurality of values, one corresponding to one or more of the electrical contacts of the contact mechanism, such that the CRES threshold parameter is individually adjustable for one or more of the electrical contacts of the contact mechanism. At 110, the contact mechanism is cleaned upon the at least one statistic of the statistical data set exceeding the at least one CRES threshold parameter. For example, the at least one statistic could be an average value of the CRES data of at least some of the electrical contacts relative to a CRES threshold, or a threshold number of electrical contacts exceeding a CRES threshold that is an average of the individual CRES thresholds for at least some of the electrical contacts of the contact mechanism.

Figure 4:
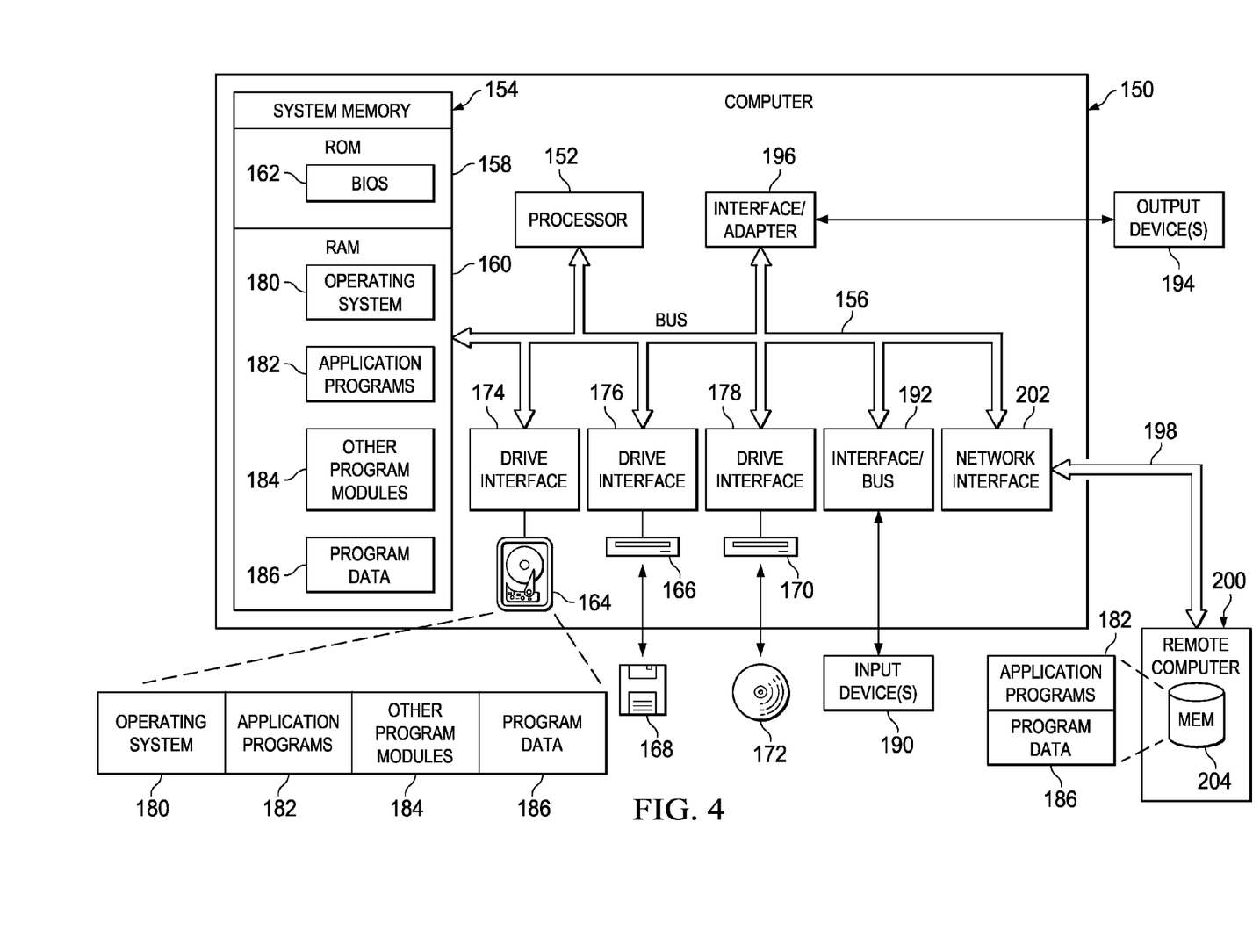
FIG. 4 illustrates an example of a computer system that can be implemented to measure CRES of a contact mechanism in a test system in accordance with an aspect of the invention.

In the example of FIG. 3, reference numbers 112 and 114 refer to an adaptive cleaning configuration. At 112, the statistical data set is analyzed to determine if at least one CRES statistic is within a range of acceptable values. The range of acceptable values can be a range of acceptable measured CRES values for a given periodic testing interval and/or a cleaning configuration associated with aggressiveness of cleaning. The periodic testing interval can be a time interval between periodic cleaning of the contact mechanism or can be a number of DUTs that are tested between cleanings of the contact mechanism. The cleaning configuration associated with aggressiveness of cleaning can include parameters associated with the cleaning operation of the contact mechanism, such as a number of contacts of the contact mechanism with a cleaning surface, a length of contact of the contact mechanism along the cleaning surface, or duration of contact of the contact mechanism with the cleaning surface. At 114, the cleaning frequency and/or aggressiveness of cleaning associated with the DUTs is adjusted based on the at least one CRES statistic. The cleaning frequency and/or aggressiveness can be increased based on the at least one CRES statistic being greater than the range of acceptable values, and the cleaning frequency and/or aggressiveness can be decreased based on the at least one CRES statistic being less than the range of acceptable values. It is to be understood that, in the example of FIG. 3, the method is not limited to implementing just one of reactive cleaning and adaptive cleaning, but can instead implement all of or selected elements of both the reactive and the adaptive cleaning configurations FIG. 4 illustrates an example of a computer system 150 that can be employed to implement systems and methods described herein, such as based on computer executable instructions running on the computer system. The computer system 150 can be implemented on one or more general purpose networked computer systems, embedded computer systems, routers, switches, server devices, client devices, various intermediate devices/nodes and/or stand alone computer systems. Additionally, the computer system 150 can be implemented as part of a network analyzer or associated design tool running computer executable instructions to perform methods and functions, as described herein.

The computer system 150 includes a processor 152 and a system memory 154. A system bus 156 couples various system components, including the system memory 154 to the processor 152. Dual microprocessors and other multi-processor architectures can also be utilized as the processor 152. The system bus 156 can be implemented as any of several types of bus structures, including a memory bus or memory controller, a peripheral bus, and a local bus using any of a variety of bus architectures. The system memory 154 includes read only memory (ROM) 158 and random access memory (RAM) 160. A basic input/output system (BIOS) 162 can reside in the ROM 158, generally containing the basic routines that help to transfer information between elements within the computer system 150, such as a reset or power-up.

The computer system 150 can include a hard disk drive 164, a magnetic disk drive 166, e.g., to read from or write to a removable disk 168, and an optical disk drive 170, e.g., for reading a CD-ROM or DVD disk 172 or to read from or write to other optical media. The hard disk drive 164, magnetic disk drive 166, and optical disk drive 170 are connected to the system bus 156 by a hard disk drive interface 174, a magnetic disk drive interface 176, and an optical drive interface 184, respectively. The drives and their associated computer-readable media provide nonvolatile storage of data, data structures, and computer-executable instructions for the computer system 150. Although the description of computer-readable media above refers to a hard disk, a removable magnetic disk and a CD, other types of media which are readable by a computer, may also be used. For example, computer executable instructions for implementing systems and methods described herein may also be stored in magnetic cassettes, flash memory cards, digital video disks and the like. A number of program modules may also be stored in one or more of the drives as well as in the RAM 160, including an operating system 180, one or more application programs 182, other program modules 184, and program data 186.

A user may enter commands and information into the computer system 150 through user input device 140, such as a keyboard, a pointing device (e.g., a mouse). Other input devices may include a microphone, a joystick, a game pad, a scanner, a touch screen, or the like. These and other input devices are often connected to the processor 152 through a corresponding interface or bus 142 that is coupled to the system bus 156. Such input devices can alternatively be connected to the system bus 156 by other interfaces, such as a parallel port, a serial port or a universal serial bus (USB). One or more out device(s) 144, such as a visual display device or printer, can also be connected to the system bus 156 via an interface or adapter 146.

The computer system 150 may operate in a networked environment using logical connections 148 to one or more remote computers 150. The remote computer 148 may be a workstation, a computer system, a router, a peer device or other common network node, and typically includes many or all of the elements described relative to the computer system 150. The logical connections 148 can include a local area network (LAN) and a wide area network (WAN).

When used in a LAN networking environment, the computer system 150 can be connected to a local network through a network interface 152. When used in a WAN networking environment, the computer system 150 can include a modem (not shown), or can be connected to a communications server via a LAN. In a networked environment, application programs 182 and program data 186 depicted relative to the computer system 150, or portions thereof, may be stored in memory 154 of the remote computer 150.

By way of further example, the application programs 182 can include executable instructions programmed to measure and accumulate CRES data for one or more contact mechanisms associated with a test system, such as the functional test system 10 in the example of FIG. 1 and/or the test system 50 in the example of FIG. 2. For instance, the application programs can include executable instructions that measure CRES by forcing a fixed signal and measuring a voltage potential or a current flow associated with an ESD diode of a given DUT. The instructions can access DUT responses and/or test data (e.g., stored in a drive or RAM 160 of the computer 150 or memory 154 of a remote computer) to determine when to measure CRES or when to clean the contact mechanism based on events and/or consecutive failures of DUTs based on obtained responses. The instructions can also calculate a statistical data set of CRES data obtained for the electrical contacts of the contact mechanism over a plurality of DUTs, such as described herein. The instructions can analyze the statistical data set and can determine one or more CRES threshold parameters with which one or more statistics associated with the statistical data set can be compared. Upon determining CRES data, CRES threshold parameters, and/or statistics in the statistical data set generated based on the CRES data, the application programs 182 can display them to the user via the output device 144, and/or employ the data in different application programs, which may be running on the computer system 150 or the remote computer 150. As an example, the instructions can then provide a signal to an automatic test system to clean the contact mechanism, or can provide an indication to an operator via the output device 144 to clean the contact mechanism. As another example, the instructions can adjust a frequency and/or aggressiveness of cleaning of the contact mechanism.

What have been described above are examples of the present invention. It is, of course, not possible to describe every conceivable combination of components or methodologies for purposes of describing the present invention, but one of ordinary skill in the art will recognize that many further combinations and permutations of the present invention are possible. Accordingly, the present invention is intended to embrace all such alterations, modifications, and variations that fall within the spirit and scope of the appended claims.

What is claimed is:

1. A method for cleaning a contact mechanism, the method comprising:
    measuring contact resistance (CRES) associated with a plurality of electrical contacts of the contact mechanism;
    generating at least one statistic of the measured CRES associated with the plurality of electrical contacts of the contact mechanism;
    individually generating at least one CRES threshold parameter associated with an unacceptable level of CRES for at least one of the plurality of contacts of the contact mechanism;
    comparing the at least one statistic of the measured CRES associated with the plurality of electrical contacts of the contact mechanism with the at least one CRES threshold parameter; and
    cleaning the plurality of electrical contacts of the contact mechanism upon the at least one statistic of the measured CRES exceeding the at least one CRES threshold parameter associated with at least one of the plurality of electrical contacts.

2. The method of claim 1, wherein cleaning the plurality of electrical contacts of the contact mechanism comprises cleaning the plurality of electrical contacts of the contact mechanism upon the at least one statistic of the CRES exceeding the at least one CRES threshold parameter.

3. The method of claim 1, further comprising providing stimuli to and obtaining responses from a plurality of devices-under-test (DUTs) using the contact mechanism, the responses being determinative of one of acceptance and failure for each of the plurality of DUTs.

4. The method of claim 3, wherein the responses are sensitive to variations in the CRES, such that cleaning the plurality of electrical contacts of the contact mechanism comprises cleaning the plurality of electrical contacts of the contact mechanism upon a consistent failure of a given subset of the plurality of DUTs based on the responses.

5. The method of claim 3, wherein cleaning the plurality of electrical contacts of the contact mechanism comprises cleaning the plurality of electrical contacts of the contact mechanism upon the at least one statistic of the measured CRES repeatedly exceeding the at least one CRES threshold parameter.

6. The method of claim 3, wherein the at least one statistic of the measured CRES comprises at least one of a statistical function, statistical algorithm, statistical technique, and one or more statistical filtering operations of the measured CRES associated with one of at least one of the plurality of electrical contacts of the contact mechanism across the plurality of DUTs and the plurality of electrical contacts of the contact mechanism across at least one of the plurality of DUTs.

7. The method of claim 3, wherein measuring the CRES comprises measuring the CRES associated with the plurality of electrical contacts of the contact mechanism based on at least one of a regular interval based on obtaining the test data associated with a predetermined number of the plurality of DUTs, a regular interval based on a predetermined elapsed time, and based on a determination of failure of a given one of the plurality of DUTs.

8. The method of claim 3, wherein cleaning the plurality of electrical contacts of the contact mechanism comprises cleaning the plurality of electrical contacts of the contact mechanism at a periodic time interval with a predetermined aggressiveness of cleaning.

9. The method of claim 8, wherein the at least one CRES threshold parameter comprises a range of CRES parameters, the method further comprising adjusting at least one of the periodic time interval and the aggressiveness of cleaning upon the at least one statistic of the CRES being outside the range of CRES parameters at a conclusion of the periodic time interval.

10. A functional test system comprising:
    a contact mechanism configured to deliver stimuli to and obtain responses from a plurality of devices-under-test (DUTs), the contact mechanism comprising a plurality of electrical contacts, the responses being determinative of one of acceptance and failure for each of the plurality of DUTs;

a contact resistance (CRES) tester configured to measure CRES associated with at least one of the plurality of electrical contacts of the contact mechanism and to generate a statistical data set based on the measured CRES and at least one of the plurality of DUTs; and a data analysis system configured to generate and/or apply at least one CRES threshold parameter for the contact mechanism, the at least one CRES threshold parameter being determinative of at least one of a periodic time interval and an aggressiveness of cleaning the contact mechanism based on at least one CRES statistic in the statistical data set.

11. The functional test system of claim 10, wherein the CRES tester is configured to calculate the CRES associated with the at least one of the plurality of electrical contacts of the contact mechanism upon a consistent failure of a given subset of the plurality of DUTs based on the responses.

12. The functional test system of claim 10, wherein the CRES tester is further configured to provide one of an indication of a need to clean the contact mechanism and a command to invoke cleaning of the contact mechanism upon the at least one CRES statistic in the statistical data set exceeding the at least one CRES threshold parameter.

13. The functional test system of claim 10, wherein the at least one CRES threshold parameter is determinative of cleaning the contact mechanism upon the at least one CRES statistic in the statistical data set repeatedly exceeding an unacceptable level of CRES.

14. The functional test system of claim 10, wherein the functional test system is configured to clean the contact mechanism at the periodic time interval with the aggressiveness of cleaning, and wherein the data analysis system is further configured to adjust at least one of the periodic time interval and the aggressiveness of cleaning based on a comparison of the at least one CRES statistic in the statistical data set and the at least one CRES threshold parameter at a conclusion of the periodic time interval.

15. The functional test system of claim 10, wherein each of the plurality of DUTs comprises at least one electrically conductive and/or resistive path, and wherein the CRES tester is further configured to generate at least one fixed signal to force a current flow through the at least one electrically conductive and/or resistive path, and to measure at least one signal responsive to the forced current flow through the at least electrically conductive and/or resistive path, such that the CRES tester calculates the CRES associated with the at least one of the plurality of electrical contacts of the contact mechanism based on the at least one fixed signal and the at least one signal responsive to the forced current flow to generate the statistical data set.

16. A functional test system comprising:
means for providing stimuli to and obtaining responses from a plurality of devices-under-test (DUTs), the responses being determinative of one of acceptance and failure for each of the plurality of DUTs;
means for measuring a contact resistance (CRES) associated with the means for obtaining the responses upon a plurality of consistent failures of a given subset of the plurality of DUTs based on the responses;
means for generating a statistical data set based on the CRES associated with the means for obtaining the responses; and
means for cleaning the means for obtaining the responses based on the statistical data set and at least one CRES threshold parameter.

17. The functional test system of claim 16, wherein the means for cleaning the means for obtaining the responses is further configured to clean the means for obtaining the responses upon at least one statistic in the statistical data set repeatedly exceeding an unacceptable level of CRES based on the at least one CRES threshold parameter.

18. The functional test system of claim 16, wherein the means for cleaning the means for obtaining the responses is configured to clean the means for obtaining the responses at a periodic time interval with an aggressiveness of cleaning, the functional test system further comprising means for analyzing the statistical data set to adjust at least one of the periodic time interval and the aggressiveness of cleaning based on a comparison of the statistical data set and the at least one CRES threshold parameter at a conclusion of the periodic time interval.

* * * * *